United States Patent [19]

Stevens

[11] Patent Number: 5,306,931
[45] Date of Patent: Apr. 26, 1994

[54] CCD IMAGE SENSOR WITH IMPROVED ANTIBLOOMING CHARACTERISTICS

[75] Inventor: Eric G. Stevens, Rochester, N.Y.

[73] Assignee: Eastman Kodak Company, Rochester, N.Y.

[21] Appl. No.: 51,587

[22] Filed: Apr. 22, 1993

Related U.S. Application Data

[63] Continuation of Ser. No. 797,651, Nov. 25, 1991, abandoned.

[51] Int. Cl.$^5$ ............... H01L 29/78; H01L 27/14; H01L 31/00
[52] U.S. Cl. .................. 257/223; 257/224; 257/230; 257/232; 257/233
[58] Field of Search ............ 357/24 LR, 24 M, 24; 377/60, 61, 62, 63; 358/213.19, 213.23, 213.29; 257/222, 223, 224, 225, 229, 230, 231, 232, 233

[56] References Cited

U.S. PATENT DOCUMENTS

| | | | |
|---|---|---|---|
| 3,983,395 | 9/1976 | Kim | 357/24 |
| 4,040,076 | 8/1977 | Kosonocky et al. | 357/24 |
| 4,242,599 | 12/1980 | Suzuki | 357/24 |
| 4,375,597 | 3/1983 | Kosonocky | 357/24 |
| 4,389,661 | 6/1983 | Yamada | 357/24 |
| 4,460,912 | 7/1984 | Takashita et al. | 357/24 |
| 4,473,836 | 9/1984 | Chamberlain | 357/24 |
| 4,554,571 | 11/1985 | Arques | 357/24 |
| 4,873,561 | 10/1989 | Wen | 357/24 |
| 4,907,050 | 3/1990 | Yamada | 357/24 |
| 4,967,249 | 10/1990 | Suni | 357/24 |
| 4,984,047 | 1/1991 | Stevens | 357/24 |

FOREIGN PATENT DOCUMENTS

WO89/09495 10/1989 PCT Int'l Appl. ............ 357/24 LR

Primary Examiner—Ngan Ngo
Attorney, Agent, or Firm—Raymond L. Owens

[57] ABSTRACT

An image sensor having improved antiblooming characteristics includes a plurality of photodetectors in a substrate at a surface thereof and arranged in an array of columns and rows. A CCD shift register extends along each column of the photodetectors. A separate overflow drain is adjacent each photodetector and an overflow barrier extends between each photodetector and its adjacent drain. Each photodetector has an active region of one conductivity type which is divided into first and second portions. The first portion of the active region has a higher concentration of the impurities of the one conductivity type than the second portion so as to have a lower potential during operation thereof. Thus, the charge carriers generated in the first portion will flow into the second portion where they are stored. This reduces the capacitance of the photodetector to increase it antiblooming characteristics while maintaining the sensitivity of the photodetector.

14 Claims, 4 Drawing Sheets

CCD IMAGE SENSOR WITH IMPROVED ANTIBLOOMING CHARACTERISTICS

This is a continuation of application Ser. No. 797,652, filed Nov. 25, 1991, now abandoned.

FIELD OF THE INVENTION

The present invention relates to a charge-coupled device (CCD) image sensor having photodetectors with antiblooming features, and, more particularly, to such an image sensor having improved antiblooming characteristics without sacrificing other performance characteristics of the photodetectors.

BACKGROUND OF THE INVENTION

One type of a CCD image sensor, in general, comprises a plurality of photodetectors arranged in an array, such as an array of rows and columns, and CCD shift registers between the columns of the photodetectors. The photodetectors in each column are coupled, such as by a transfer gate, to their adjacent shift register so that the charge carriers generated and accumulated in the photodetectors can be selectively transferred to the shift register. The shift registers transfer the charge carriers to the read-out circuit of the imager.

One problem which has arisen in this type of imager is referred to as "blooming." If, during the accumulation period of the imager (i.e., the period when the photodetectors are receiving photons from the image and converting the photons to charge carriers), a photodetector accumulates an excess amount of charge carriers, some of the charge carriers will overflow from the photodetector into the adjacent shift register and/or photodetector. This adversely affects the charge carriers in the shift register being transferred to the read-out circuit causing "blooming."

A conventional technique used for preventing blooming (i.e., an antiblooming technique) uses an overflow drain adjacent the photodetector with the drain being isolated from the photodetector by a potential barrier. The potential barrier between the photodetector and antiblooming drain is lower than the barrier provided by the transfer gate between the photodetector and the CCD shift register during the accumulation period. Thus, if the charge level in the photodetector reaches a sufficient amount to lower the photodetector potential to a level below that of the barrier between the photodetector and the antiblooming drain, additional signal carriers are swept over into the antiblooming drain where they are removed by the drain supply. This prevents excess charge from flowing into the shift register during the integration period and thereby prevents blooming.

The amount of antiblooming protection, $X_{AB}$, is defined as the ratio of the exposure level which causes blooming to the saturation exposure level. For a constant integration time and with no, or negligibly small levels of smear, the amount of antiblooming protection is given by:

$$X_{AB} = \exp[q(N_{CCD} - N_{PD})/CV_t]$$

where q is the electron charge $N_{CCD}$ is the charge capacity of the CCD, $N_{PD}$ is the capacity of the detector element at saturation, C is the detector's capacitance, $V_t$ is the thermal voltage as given by $nkT/q$, n is the nonideality factor of the antiblooming structure, k is Boltzmann's constant, and T is the absolute temperature of the detector. Hence $X_{AB}$ is seen to be exponentially dependent on C.

Also, the photoresponse nonlinearity of a photodetector at saturation operating under these conditions is given by:

$$PRNL = [CV_t/RE_{SAT}]\ln(2)$$

where R is the detector's responsivity in amps/watt/m$^2$, and $E_{SAT}$ is the saturation exposure in joules/m$^2$. Thus, the photoresponse nonlinearity (PRNL) is linearly dependent on C.

Although simply reducing the area of the photodetector reduces its capacitance and thereby improves antiblooming characteristics, it also results in a reduction in responsivity because of the loss in photoactive area. Therefore, it would be desirable to be able to reduce the storage area of a photodetector so as to reduce its capacitance while maintaining a large photoactive area.

SUMMARY OF THE INVENTION

In a solid state imager having photodetectors with an antiblooming drain adjacent each photodetector, the storage area of each photodetector is reduced while maintaining a large photoactive area by providing one portion of the photodetector with a lower potential than the remaining portion of the photodetector, such as by increasing the doping density of the one portion over that in the remaining portion of the photodetector. Charge carriers then generated in the one portion of the photodetector will then flow into the remaining portion where they are stored.

A solid state imager of the present invention comprises a body of a semiconductor material of one conductivity type having a surface and at least one photodetector region in the body at the surface. A CCD shift register is along the photodetector region and a drain region is in the body at the surface and adjacent the photodetector region. A barrier is between the drain region and the photodetector region. The photodetector region has first and second portions with the first portion having a lower potential than the second portion so that during operation thereof charge carriers generated in the first portion flow into the second portion.

The invention will be better understood from the following more detailed description taken with the accompanying drawings.

The drawings are not necessarily to scale.

DETAILED DESCRIPTION

Figure 1:
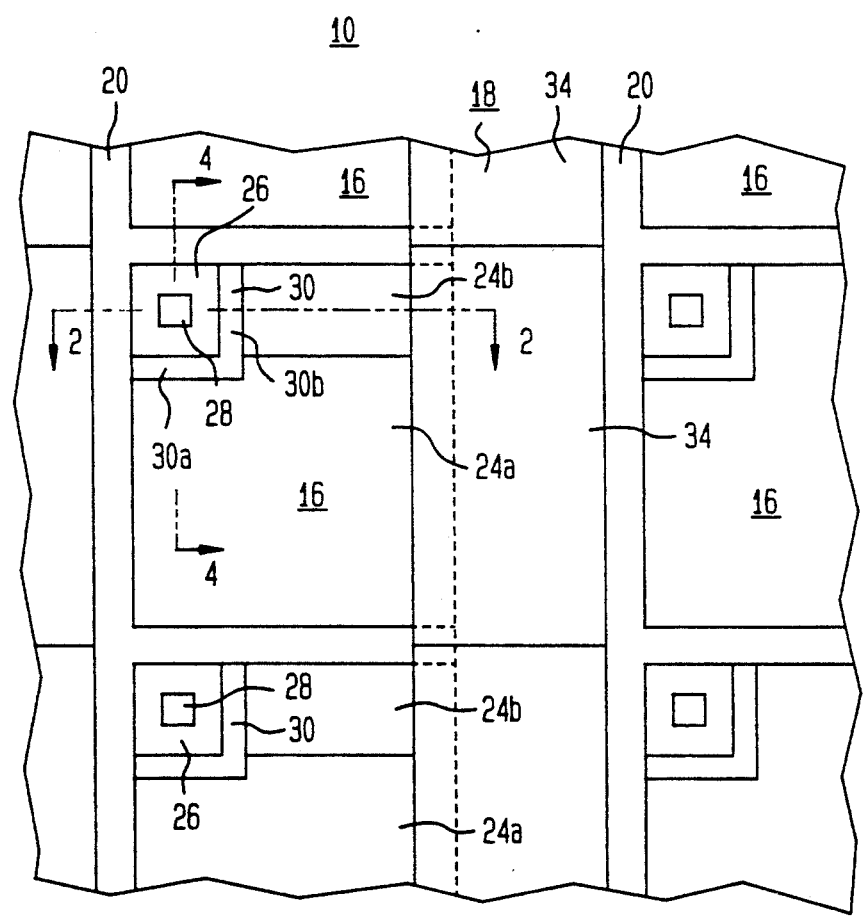
FIG. 1 is a top plan view of a portion of a CCD image sensor which incorporates the present invention.
Figure 2:
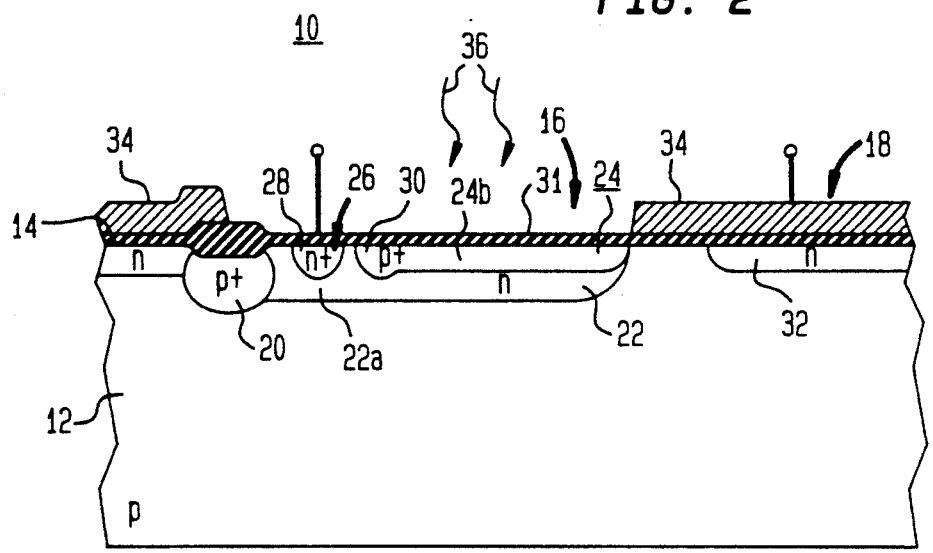
FIG. 2 is a cross-sectional view taken along line 2—2 of FIG. 1.
Figure 4:
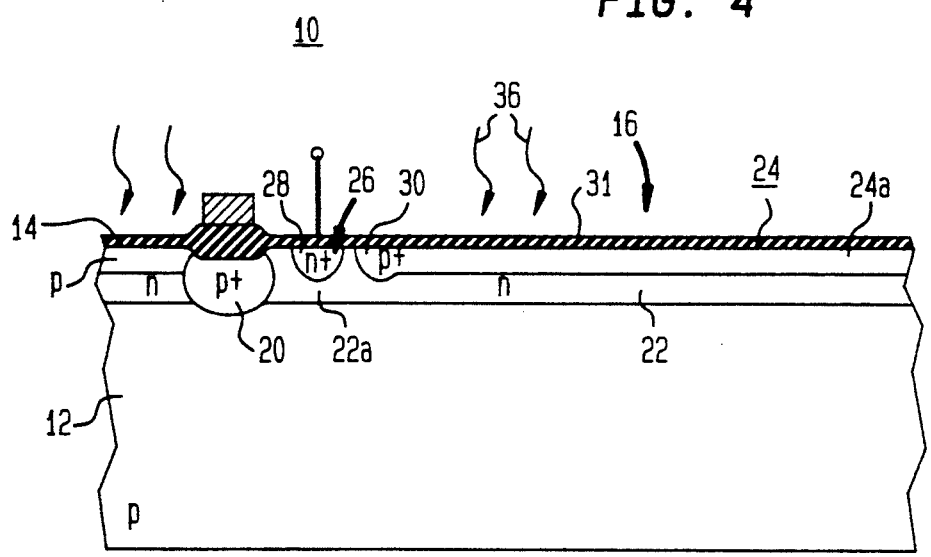
FIG. 4 is a cross-sectional view taken along line 4—4 of FIG. 1.

Referring to FIGS. 1, 2 and 4, there is shown a top plan view (FIG. 1), a cross-section view (FIG. 2), and a cross-sectional view (FIG. 4), of a CCD image sensor 10 in accordance with the present invention. Image sensor 10 comprises a substrate body 12 having a surface 14. The substrate body 12 is of a semiconductor material, such as single crystalline silicon, of one conductivity type, typically p-type In the body 12 and along the surface 14 are a plurality of spaced photodetectors 16 which are arranged in an array, typically in rows and columns. Along each column of the photodetectors 16 is a separate CCD shift register 18. Each shift register 18 is adapted to receive charge carriers from its adjacent column of photodetectors 16 and transfer the charge carriers to an output circuit (not shown).

A channel stop 20 is in the body 12 and extends along the side of each column of photodetectors 16 opposite the shift register 18 for the column of photodetectors 16. The channel stop 20 also extends between adjacent photodetectors 16 in the column. As shown in FIGS. 2 and 4, the channel stop 20 is a region of the same conductivity type as the body 12, but of higher conductivity (shown as p+type) in the body 12 and extending along the surface 14.

As shown, each of the photodetectors 16 is a photodiode of the pinned type. However, the photodetectors 16 can be of other types, such as a photocapacitor. As shown in FIGS. 2 and 4, each photodiode 16 comprises a first region 22 of n-type conductivity (typically having a dopant concentration of about $10^{17}$ impurities/cm$^3$) in the body 12 at the surface 14. The first region 22 extends from the shift register 18 to the channel stop 20. A second region 24 of p-type conductivity is in a portion of the first region 22. As shown in FIG. 1, the second region 24 is formed of first and second portions 24a and 24b. The first portion 24a has a concentration of the p-type conductivity dopant greater than the concentration of the dopant in the second portion 24b, or the second portion 24b can have a higher concentration of n-type dopant than the first portion 24a.

A drain 26 is in the body 12 at one corner of each of the photodetectors 16. The drain 26 comprises a portion 22a of the n-type first region 22 and an n+type contact region 28 in the portion 22a. The contact region 28 has a concentration of about $10^{19}$ impurities/cm$^3$. An antiblooming barrier 30 extends around the drain 26. The antiblooming barrier 30 comprises a highly conductive p-type region, (shown as p+type) in the body 12 at the surface 14. The portion 30a of the barrier 30 along the first portion 24a of the second region 24 has a dopant concentration greater than the first portion 24a and the portion 30b of the barrier 30 along the second portion 24b of the second region 24 has a doping concentration greater than the second portion 24b, but not as great as the portion 30a of the barrier 30. The second region 24 of the photodiode 16 extends up to the barrier 30.

A thin layer 31 of a dielectric material, typically silicon dioxide, is on the surface 14 of the body 12. Each shift register 18 comprises a channel region 32 of n-type conductivity (having a concentration of about $10^{17}$ impurities/cm$^3$) in the body 12 at the surface 14. The channel region 32 extends along and is spaced from its adjacent column of photodetectors 16. A plurality of conductive gates 34 are on the dielectric layer 31 and extend across the channel region 32. The gates 34 are positioned along the channel region 32 and there is at least one gate 34 for each of the photodetectors 16. At least some of the gates 34 extend across the space between the channel region 32 and the photodetectors 16 to serve as transfer gates to permit the transfer of charges from the photodetectors 16 to the channel region 32.

In the operation of the image sensor 10, light is directed into the photodetectors 16 as indicated by the arrows 36 in FIGS. 2 and 4. The photodetectors 16 convert the light to electrons which are stored in the photodetectors 16. By applying a proper potential to the gates 34, the stored carriers (i.e., the electrons) are transferred to the channel region 32 of the CCD shift register 18. Again by clocking the gates 34 with the proper potentials, the carriers are then transferred along the channel region 32 to an output circuit (not shown).

Figure 3:
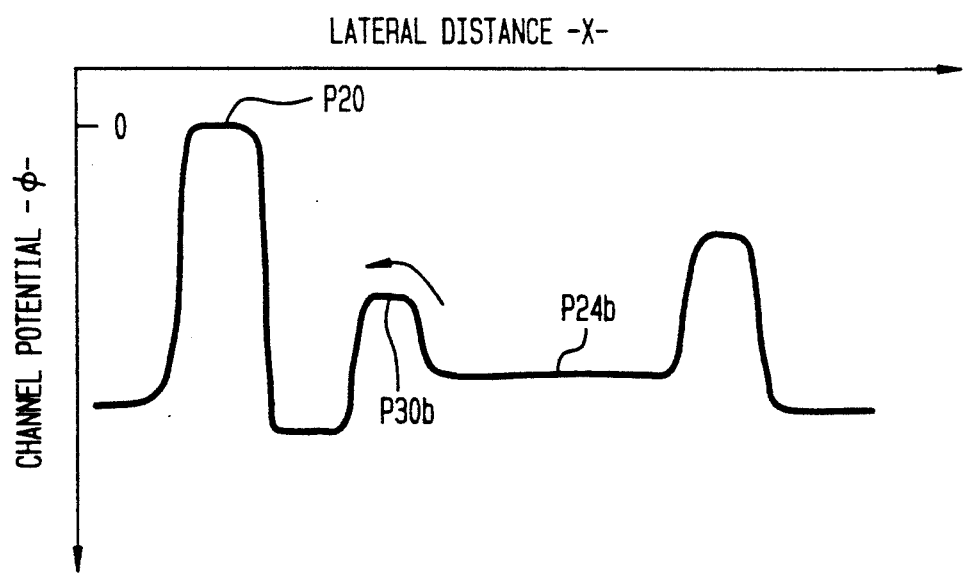
FIG. 3 is a diagram showing the electrical potentials in the various portions of the image sensor along the cross-section of FIG. 2.
Figure 5:
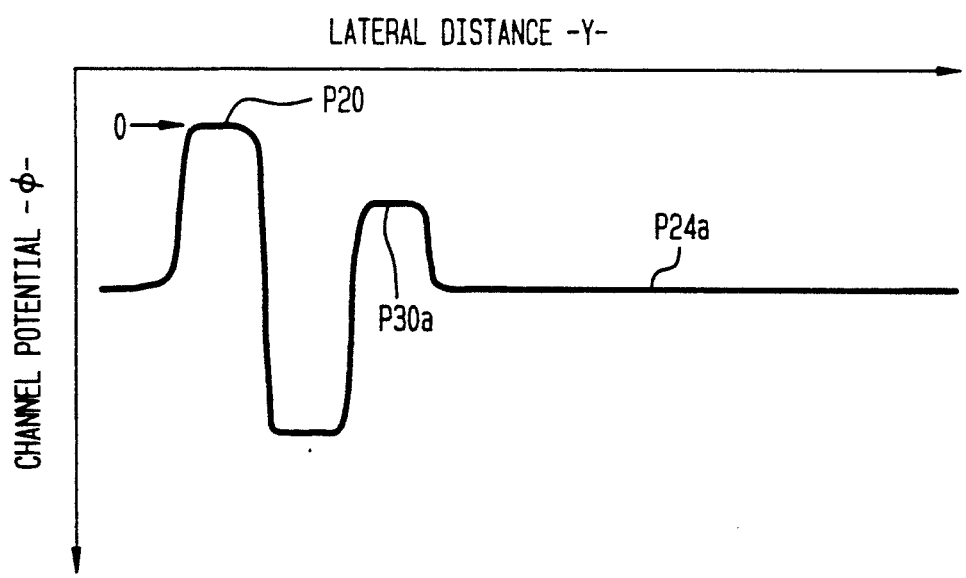
FIG. 5 is a diagram showing the electrical potentials in the various portions of the image sensor along the cross-section of FIG. 4.
Figure 6:
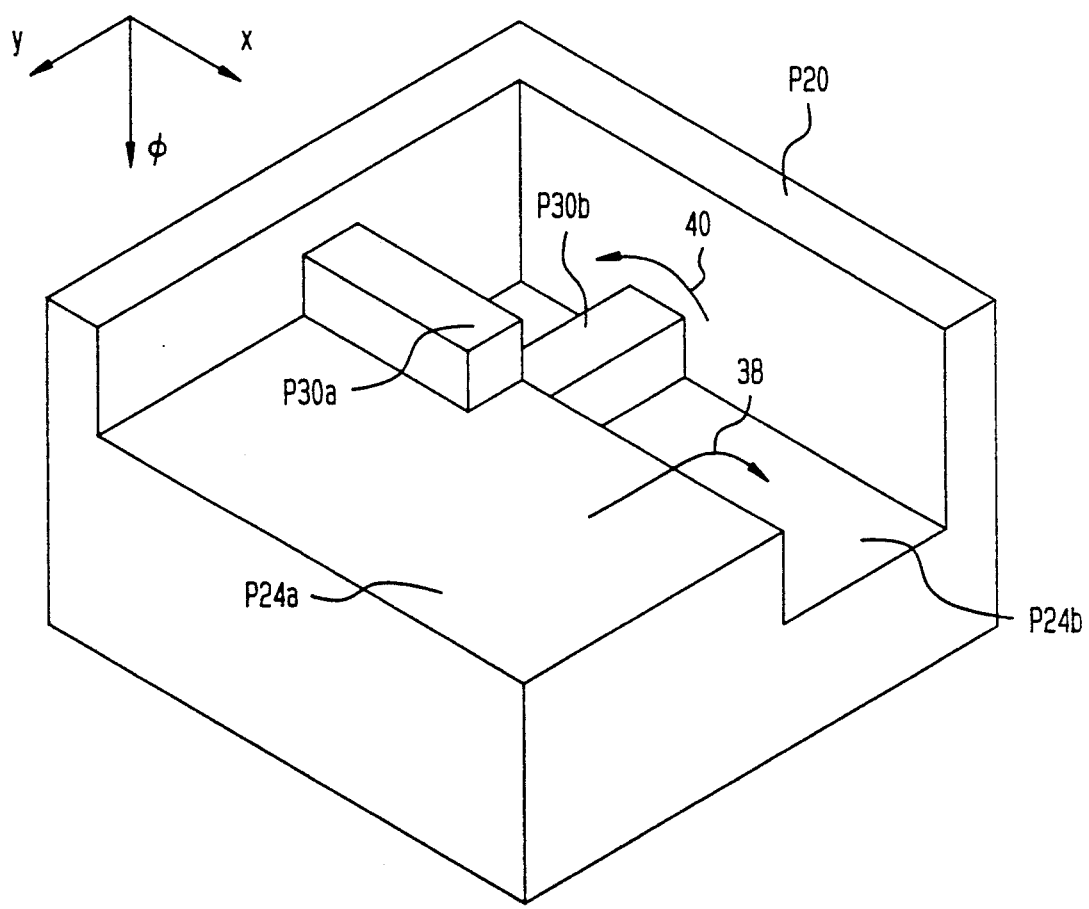
FIG. 6 is a three dimensional diagram of the channel potentials in the various portions of the image sensor of the present invention.

Referring to FIGS. 3, 5 and 6, there are shown diagrams of the potentials in the various portions of the image sensor 10. FIG. 3 shows the potentials in the portions of the image sensor shown in the cross-section of FIG. 2, FIG. 5 shows the potentials in the portions of the image sensor shown in the cross-section of FIG. 4, and FIG. 6 is a three dimensional diagram of the potentials in one photodetector 16. As can be seen in these diagrams, because of the difference in the impurity concentration in the first and section portions 24a and 24b of the second region 24 of the photodiode 16, the potential P24a in the first portion 24a is less than the potential P24b in the second portion 24b. Thus, carriers which are generated in the first portion will flow into the deeper well in the second portion 24b, as indicated by the arrow 38 in FIG. 6, where they are stored.

The potential P20 of the channel stop 20 is lower than both the potentials P24a and P24b of the first and second portions 24a and 24b. This provides a barrier to prevent the carriers from flowing from one photodiode 16 to the next or from a photodiode 16 to an adjacent CCD shift register 18.

The potential P30a of the portion of the barrier region 30 between the drain 26 and the first portion 24a of the second layer 24 is lower than the potential P24a of the first portion 24a. The potential P30b of the portion of the barrier region 30 between the drain 26 and the second portion 24b of the second layer is lower than the potential P24b of the second portion 24b. Thus, under normal conditions, charge carriers from the second region 24 are prevented from flowing into the drain. However, if the level of the carriers collected in the second portion 24b of the second region 24 fills the second portion 24b, any additional carriers will overflow the barrier provided by the potential P24b and flow into the drain contact 26, as indicated by the arrow 40 in FIG. 6. This prevents blooming. The potential difference between the second portion 24b and the adjacent portion 30b of the barrier 30 is less than the potential difference between the first and second portions 24a and 24b of the second region 24. Thus, excess carriers collected in the second portion 24b will overflow the barrier 30b to the drain 26 before they will flow back into the first portion 24a.

By using only a portion of the photodetector 16 for storing generated charge carriers, the capacitance of the photodetector 16 is greatly reduced. This improves the amount of antiblooming protection and reduces photoresponse nonlinearity. However, the entire photodetector 16 is still being used to collect detected light and to generate electrons from the light. Thus, the photoresponse of the photodetector 16 is not reduced.

Since the capacitance of the photodetector 16 is reduced, the maximum voltage swing across the photodiode 16 at saturation is increased. That is, the barrier height between the second portions 24b of the second region 24 and the second portion 30b of the barrier 30 must be increased in inverse proportion to the reduction in storage area. The sensitivity of the barrier height (the potential difference between the second portions 24b of the second region 24 and the second portion 30b of the barrier 30) to variations of processing parameters, such as implant dose, implant energy, and oxide thickness variations is inversely proportional to the barrier height. Therefore, any barrier height variations become a smaller fraction of the saturated diode's voltage swing as the capacitance is reduced. Thus, by increasing the barrier height, the photodetector's charge capacity becomes less sensitive to the various processing parameters.

Thus, there is provided by the present invention an image sensor having a plurality of photodetectors arranged in an array with CCD shift registers for carrying away the charge carriers from the photodetectors. Each of the photodetectors has an antiblooming drain and barriers means for controlling blooming. Each photodetector has a storage area which is smaller than the overall area of the photodetector to reduce the capacitance of the photodetector. This improves the antiblooming characteristics and reduces the photoresponse nonlinearity of the photodetectors without loss of response. In addition, the photodetectors have reduced sensitivity to processing variations.

It is to be appreciated and understood that the specific embodiments of the invention are merely illustrative of the general principles of the invention. Various modifications may be made consistent with the principles set forth. For example, although the photodetectors 16 are shown as being pinned diodes, other types of photodetectors can be use, such as photocapacitors and/or an n-type conductivity substrate. Also, although the image sensor 10 is shown as having a lateral overflow drain type structure, it can have a vertical overflow drain structure. In addition, the image sensor is shown as being of a two dimensional array, it can be a linear array or any other type of image sensor having photodetectors and shift registers.

What is claimed is:

1. An image sensor comprising:
a body of a semiconductor material of one conductivity type having a surface;
at least one photodetector region in the body at the surface, the photodetector region having first and second portions with the first portion having a lower potential than the second portion so that charge carriers generated in the first portion will flow into the second portion, the photodetector having at least one active region of a conductivity type with a first portion of the active region having an impurity concentration of the conductivity type greater than that of a second portion;
a shift register along the detector;
a drain region in the body and being adjacent the photodetector region; and
barrier means between the drain region and the photodetector region, the barrier means being a region of the same conductivity type as the active region of the photodetector but having a higher concentration of the conductivity impurity than the active region.

2. The image sensor of claim 1 in which the first and second portions of the active region each extend up to a separate portion of the barrier region.

3. The image sensor of claim 2 in which the portion of the barrier region to which the first portion of the active region extends has an impurity concentration greater than the portion of the barrier region to which the second portion of the active region extends.

4. The image sensor of claim 3 in which the potential difference between the first and second portions of the active region is greater than the potential difference between the second portion of the active region and the portion of the barrier region to which the second portion extends.

5. The image sensor of claim 4 in which the photodetector includes in the body at the surface thereof a first region of a second conductivity type opposite that of the body and a second region of the one conductivity type in the first region forming a p-n junction therebetween, and the second region is formed with the first and second portions.

6. An image sensor comprising:
a body of a semiconductor material of one conductivity type having a surface;
a plurality of photodetectors in the body at the surface, the photodetectors being arranged in an array of at least one line, and each of the photodetectors having first and second portions with the first portion having a lower potential than the second portion so that charge carriers generated in the first portion will flow into the second portion, each photodetector having at least one active region of a conductivity type with a first portion of the active region having an impurity concentration higher than that of the second portion;
a shift register in the body and extending along the line of the photodetectors;
a plurality of drain regions in the body, each of the drain regions being adjacent a separate one of each of the photodetectors; and
barrier means between each drain region and the portions of its adjacent photodetector, the barrier means being a region of the same conductivity type as the active region of the photodetector but having a higher impurity concentration than the active region.

7. The image sensor of claim 6 in which the first and second portions of the active region of each photodetector extends up to a separate portion of its respective barrier region.

8. The image sensor of claim 7 in which the portion of each barrier region to which the first portion of its respective active region extends has an impurity concentration greater than the impurity concentration in the portion of the barrier region to which the second portion of the active region extends.

9. The image sensor of claim 8 in which the potential difference between the first and second portions of the active region of each photodetector is greater than the potential difference between the second portion of the active region and the portion of the barrier region to which the second portion extends.

10. The image sensor of claim 9 in which each photodetector comprises in the body at the surface thereof a first region of a second conductivity type opposite that of the body and a second region of the one conductivity type in the first region and forming a p-n junction there-with and the second region is formed into the first and second portions.

11. The image sensor of claim 6 in which the photodetectors are arranged in an array of rows and columns with each column being in a line and a separate shift register extends along each column of the photodetectors.

12. The image sensor of claim 6 further comprising a channel stop region extending along the side of the line of photodetectors opposite the shift register and between adjacent photodetectors.

13. The image sensor of claim 6 in which each of the shift registers is a CCD shift register having a channel region in the substrate and extending along and spaced from the line of photodetectors and a plurality of gates extending across and insulated from the channel region.

14. An image sensor comprising: a body of a semiconductor material having a surface;
  a plurality of photodetectors in the body at the surface, the photodetectors being arranged in an array of at least one line, and each of the photodetectors having first and second photodetecting portions with the first photodetecting portion having a lower potential than the second photodetecting portion so that substantially all of the charge carriers generated in the first photodetecting portion will flow into the second photodetecting portion so that only said second photodetecting portion is used to store the charge carriers generated in both first and second photodetecting portions;
  a shift register in the body and extending along the line of photodetectors;
  a drain region in the body adjacent each of the photodetectors; and
  a barrier region between each drain region and the portions of its adjacent photodetector, wherein the barrier region is located between said drain region and said first photodetecting portion.

* * * * *